United States Patent
Li (10) Patent No.: US 7,190,784 B2
(45) Date of Patent: Mar. 13, 2007

(54) METHOD AND APPARATUS FOR ADAPTIVE DC LEVEL CONTROL

(75) Inventor: Jin Li, Austin, TX (US)

(73) Assignee: Legerity, Inc., Austin, TX (US)

( * ) Notice: Subject to any disclaimer, the term of this patent is extended or adjusted under 35 U.S.C. 154(b) by 1169 days.

(21) Appl. No.: 09/751,421

(22) Filed: Dec. 29, 2000

(65) Prior Publication Data

US 2002/0084923 A1 Jul. 4, 2002

(51) Int. Cl.
*H04M 1/00* (2006.01)

(52) U.S. Cl. ............. 379/413; 379/399.01; 379/395.01

(58) Field of Classification Search ........... 379/395.01, 379/399.01, 413

See application file for complete search history.

(56) References Cited

U.S. PATENT DOCUMENTS

| | | | | |
|---|---|---|---|---|
| 6,671,373 B1 * | 12/2003 | Pang et al. | ............ | 379/399.01 |
| 6,735,302 B1 * | 5/2004 | Caine et al. | ................ | 379/413 |
| 6,922,470 B2 * | 7/2005 | Betty et al. | ................ | 379/413 |

* cited by examiner

*Primary Examiner*—Jefferey F. Harold
(74) *Attorney, Agent, or Firm*—Williams, Morgan & Amerson, P.C.

(57) ABSTRACT

A method and apparatus is provided for DC level control in a line card. The method includes receiving a digital input signal, determining a first DC component value of the digital input signal at a first preselected time, and determining a second DC component value of the digital input signal at a second preselected time. The method further includes determining a difference between the first DC component value and the second DC component value. The method includes providing the first DC component value to a digital-to-analog converter in response to determining that the difference is less than a first preselected value. The apparatus includes a digital-to-analog converter and logic. The logic is coupled to the digital-to-analog converter, wherein the logic is capable of receiving a digital input signal, determining a first DC component value of the digital input signal at a first preselected time, and determining a second DC component value of the digital input signal at a second preselected time. The logic is farther capable of determining a difference between the first DC component value and the second DC component value, and providing the first DC component value to the digital-to-analog converter in response to determining that the difference is less than a first preselected value.

20 Claims, 7 Drawing Sheets

METHOD AND APPARATUS FOR ADAPTIVE DC LEVEL CONTROL

CROSS REFERENCE TO RELATED APPLICATIONS

This application is related to U.S. patent application Ser. No. 09/558,189, filed Apr. 26, 2000, entitled "Method and Apparatus for DC Level Control," the entirety of which is hereby incorporated by reference.

BACKGROUND OF THE INVENTION

1. Field of the Invention

This invention relates generally to telecommunications, and, more particularly, to a method and apparatus for adaptive DC level control for a telephone line card.

2. Description of the Related Art

In communications systems, particularly telephony, it is a common practice to transmit signals between a subscriber station and a central switching office via a two-wire bi-directional communication channel. A line card generally connects the subscriber station to the central switching office. A line card typically includes at least one subscriber line interface circuit (SLIC) as well as a subscriber line audio-processing circuit (SLAC). The primary functions of the line card may include supplying talk battery, performing impedance matching, determining whether telephonic equipment is on-hook or off-hook, and handling ringing signals, voice signals, and testing signals.

Subscriber line interface circuits generally include a switch-hook detection circuit that supervises telephone operation by detecting whether a telephone is either on-hook or off-book. An "off-hook" condition occurs when an end user lifts the handset of a telephone from the cradle, thereby activating the telephone's hook switch. Conversely, an "on-hook" condition occurs when the handset is placed back in the telephone cradle, thereby terminating the telephone service. Upon detecting the on-hook or off-hook condition, the switch-hook information is passed to the system software of the line card, which then either provides or terminates service.

Upon requesting service, a user may establish a connection with a remote user by dialing the telephone number of that user. Telephone dialing may be in the form of dial pulses or tones. Pulse dialing includes generating a series of electrical interrupts or pulses across the telephone line. One method of generating electrical pulses is by toggling between on-hook and off-hook states such that each transition from an on-hook to off-hook state represents one pulse. The number of pulses generated usually represents the digit that is dialed.

The off-hook/on-hook ratio (also referred to as make/break ratio) applied to the loop during pulse dialing is typically 40 to 60; that is, the loop is closed 40 percent of the time and is open 60 percent of the time. The break interval is generally allowed to vary from about 58 percent to 64 percent. However, because of the pulse distortion caused by the loop, the pulse receivers or detectors in the central office must be able to properly respond to a break interval of 55 percent to 65 percent. The dial rate can vary between 8 and 12 pulses per second.

Telephone systems need DC feed to control the battery feed to the subscriber loop. DC feed delivers enough power for long loop and gradually reduces the power for short loop. A digital signal processing algorithm controls the DC feed curve. During the transition from off-hook to on-hook, the loop impedance changes from low to high and the measured loop voltage between the tip and ring terminals goes from low to high. Generally, an electronic DC feed control is slow to react to sudden changes in the loop impedance. As such, if the loop impedance is high enough during an off-hook to on-hook transition, the DC feed driver may be saturated.

Saturation may occur because an impedance change on a subscriber loop causes a DC level shift between several volts to ten volts or more, depending upon the loop current. The SLAC devices are typically five-volt digital components with a maximum peak to peak operating voltage of less than five volts. Thus, a sudden DC level shift causes one or more components within the SLIC and SLAC devices to saturate, sometimes for as long as 80 milliseconds, which may interfere with normal operation of such devices.

During saturation, the measured loop voltage between the tip and ring terminals and the measured current may not accurately reflect the loop condition. Thus, an inaccurate measurement of the loop impedance may result in a false detection, thereby causing switch-hook distortion. In addition, switch-hook distortion may also occur during pulse dialing because of capacitance and inductance present on the subscriber line or may occur when additional telephones go off-hook/on-hook on the subscriber loop, thereby causing a sudden impedance fluctuation.

Particular care must be taken when implementing DC level control functionality in a line card that is capable of supporting voice and data. A line card capable of supporting both voice and data may employ an analog-to-digital converter (A/D), as well as a digital-to-analog (D/A) converter, for DC level control. The D/A converter may be provided with a stream of digitized input samples, which are then converted to an analog signal by the D/A converter. The range of values of the digitized samples will generally depend on the input signal that is digitized by the A/D converter. The D/A converter may introduce a substantial amount of quantization noise, depending on the sampling rate of the D/A converter and the architecture of the D/A converter. For example, with the zero order of D/A converter, the quantization noise is flat from 0 Hz to 128 KHz. With a first order D/A sigma-delta D/A converter, the noise peaks at half of the D/A sampling frequency, Fs. If the sampling frequency equals 256 HKz, then the noise peaks at 128 HKz, which is in the frequency bin for upstream data transfer. As a result, the noise introduced may interfere with the transfer of data in the line card, thereby increasing the bit error rate of data transfer.

The present invention is directed to overcoming, or at least reducing the effects of, one or more of the problems set forth above.

SUMMARY OF THE INVENTION

In one aspect of the present invention, a method is provided for DC level control in a line card. The method includes receiving a digital input signal, determining a first DC component value of the digital input signal at a first preselected time, and determining a second DC component value of the digital input signal at a second preselected time. The method further includes determining a difference between the first DC component value and the second DC component value. The method includes providing the first DC component value to a digital-to-analog converter in response to determining that the difference is less than a first preselected value.

In another aspect of the present invention, an apparatus is provided. The apparatus includes a digital-to-analog converter and logic. The logic is coupled to the digital-to-analog converter, wherein the logic is capable of receiving a digital input signal, determining a first DC component value of the digital input signal at a first preselected time, and determining a second DC component value of the digital input signal at a second preselected time. The logic is further capable of determining a difference between the first DC component value and the second DC component value, and providing the first DC component value to the digital-to-analog converter in response to determining that the difference is less than a first preselected value.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 1:
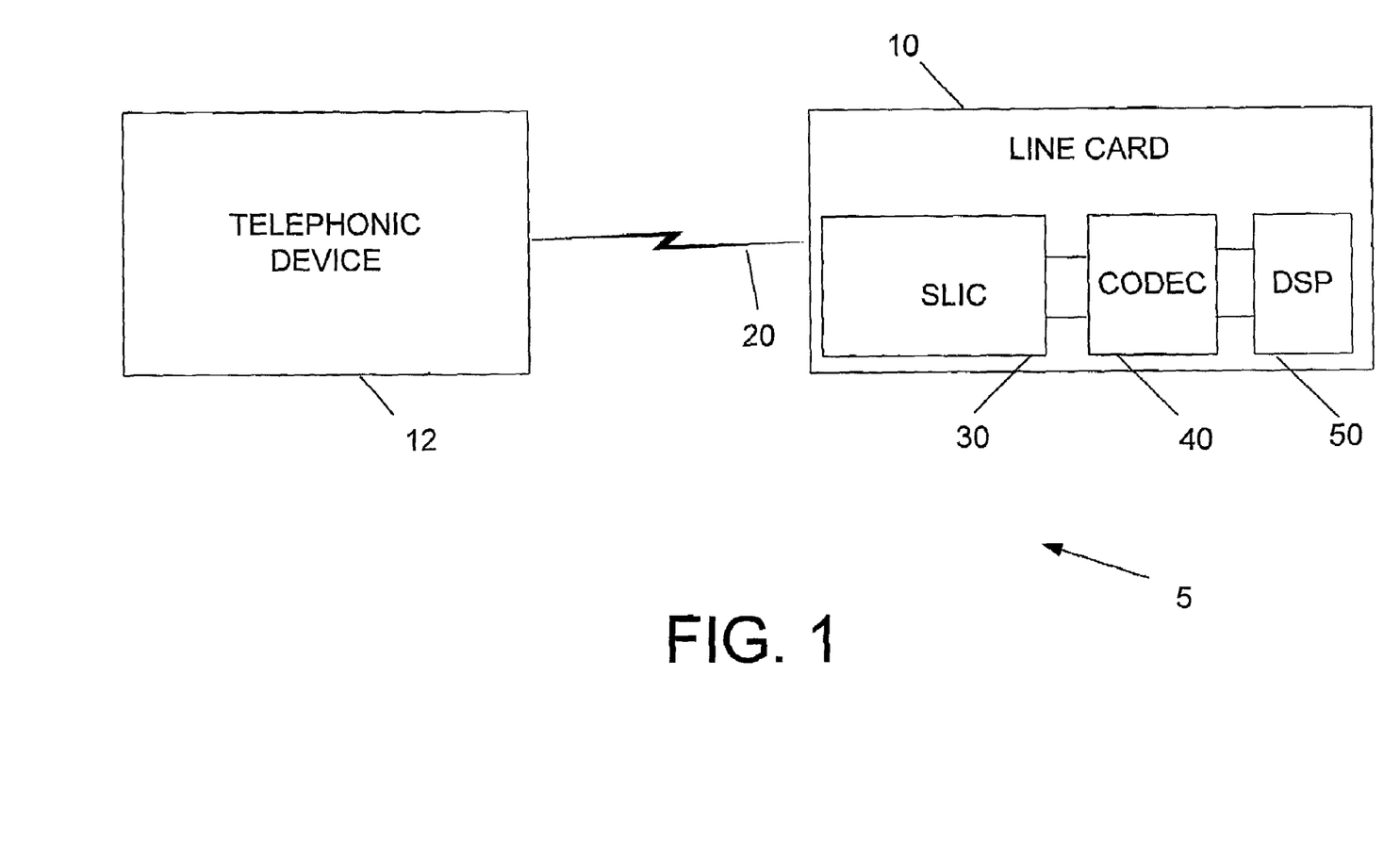
FIG. 1 illustrates a communications system in accordance with the present invention.

Referring first to FIG. 1, a simplified block diagram of a communications system in accordance with the present invention is provided. The communications system 5 includes a line card 10 that interfaces with a telephonic device 12 over a subscriber line 20. In an actual implementation, the line card 10 interfaces with a plurality of subscriber lines 20, but for clarity and ease of illustration, only one subscriber line 20 is shown. A subscriber line interface circuit (SLIC) 30 is coupled to the subscriber line 20. Hereinafter, signals received by the line card 10 over the subscriber line 20 are referred to as upstream signals, and signals transmitted by the line card 10 on the subscriber line 20 are referred to as downstream signals.

The SLIC 30 supplies an analog upstream signal to a coder/decoder (CODEC) 40. The CODEC 40 receives the analog upstream signal from the SLIC 30 and generates a digital upstream signal that is subsequently passed to a digital signal processor (DSP) 50. The DSP 50 also provides a digital signal for eventual transmission on the subscriber line 20. The CODEC 40 receives the digital signal, converts it to an analog signal, and provides the analog signal to the SLIC 30, which sends the analog signal over the subscriber line 20.

In the illustrated embodiment, the line card 10, in addition to supporting plain old telephone service (POTS), is adapted to support an x-digital subscriber line (x-DSL) modem for high bandwidth data transfer. The SLIC 30 of the line card 10 is capable of performing a variety of functions, such as battery feed, overload protection, polarity reversal, on-hook transmission, and current limiting. Only relevant portions of the SLIC 30, CODEC 40, and DSP 50 are described herein, although those of ordinary skill in the art will appreciate that these devices may perform other functions that are not described in this disclosure.

The telephonic device 12 may comprise a telephone or any other device capable of providing a communication link between at least two users. In one embodiment, the telephonic device 12 may be one of a variety of available conventional telephones, such as wired telephones and similar devices. In an alternative embodiment, the telephonic device 12 may be any device capable of performing a substantially equivalent function of a conventional telephone, which may include, but is not limited to, transmitting and/or receiving voice and data signals. Examples of the telephonic device 12 include a data processing system (DPS) utilizing a modem to perform telephony, a television phone, a DPS working in conjunction with a telephone, Internet Protocol (IP) telephony, and the like. IP telephony is a general term for the technologies that use the Internet Protocol's packet-switched connections to exchange voice, fax, and other forms of information that have traditionally been carried over the dedicated circuit-switched connections of the public switched telephone network (PSTN). One example of IP telephony is an Internet Phone, a software program that runs on a DPS and simulates a conventional phone, allowing an end user to speak through a microphone and hear through DPS speakers. The calls travel over the Internet as packets of data on shared lines, avoiding the tolls of the PSTN.

Figure 2:
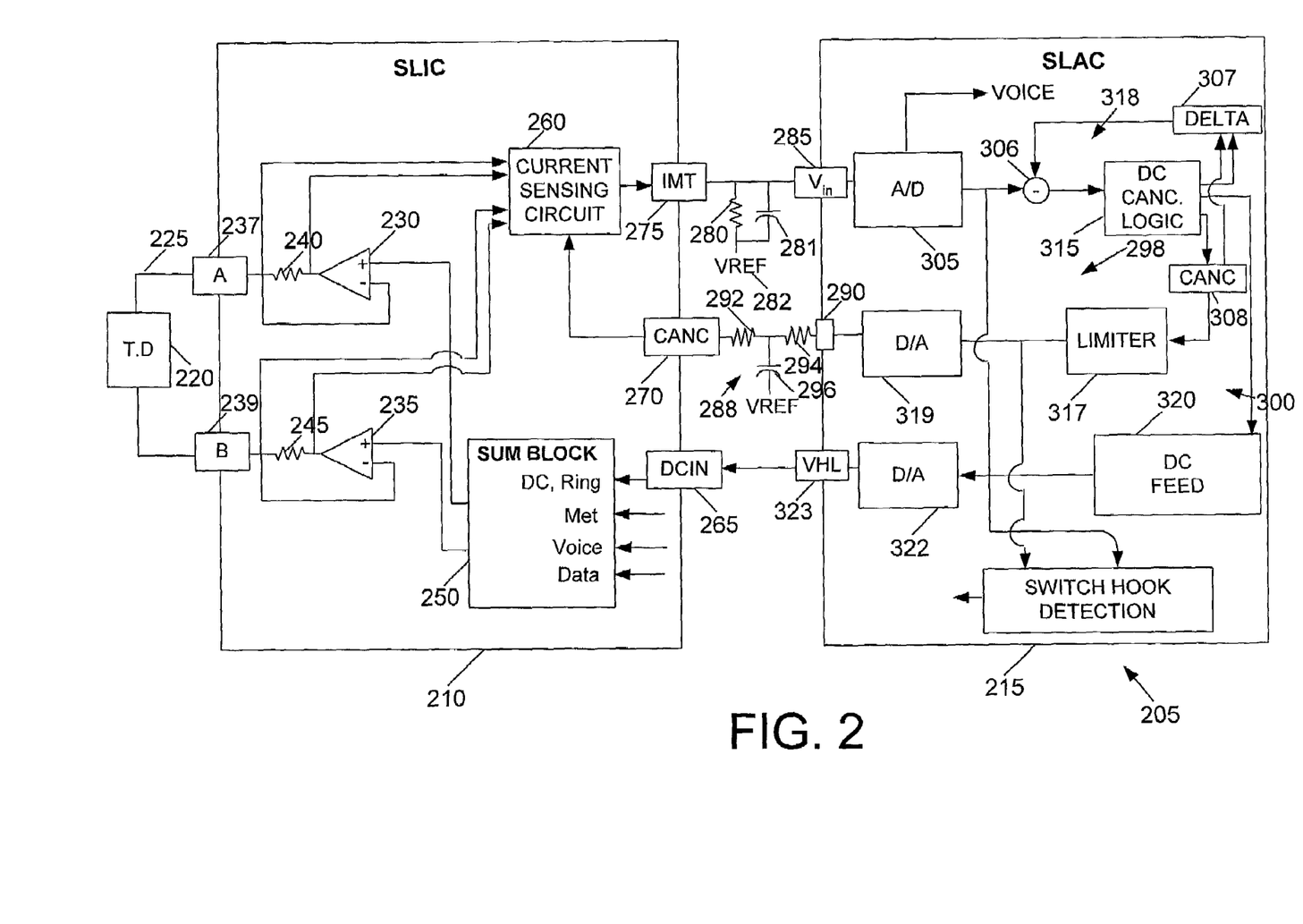
FIG. 2 depicts a block diagram of an embodiment of a host transceiver in accordance with the present invention that may be implemented in the communications system of FIG. 1.

FIG. 2 illustrates one embodiment of the line card 10 in accordance with the present invention. In the illustrated embodiment, the line card 205, in addition to supporting plain old telephone service (POTS), is adapted to implement an asynchronous digital subscriber line (ADSL) modem for high bandwidth data transfer. The ADSL protocol is described in ANSI T1.413 Issue 2, entitled, "Interface Between Networks and Customer Installation—Asymmetric Digital Subscriber Line (ADSL) Metallic Interface." Specifically, the line card 10 includes the SLIC 30, which, in the illustrated embodiment, is a voltage-feed SLIC 210. The line card 10 also includes the CODEC/DSP 40, 50, which in the illustrated embodiment are shown as a subscriber line audio-process circuit (SLAC) 215 that integrates the functions of both the CODEC 40 and DSP 50. The line card 10 may be located at a central office or a remote location somewhere between the central office and the telephonic device 12 (see FIG. 1). The line card 10 interfaces with the telephonic device 12 through tip and ring terminals 237, 239 at the SLIC 30. The combination of the telephonic device 12 and the subscriber line 20 is generally referred to as a subscriber loop.

The line card 205, which may be capable of supporting a plurality of telephone lines 225, performs, among other things, two fundamental functions: DC loop supervision and DC feed. The purpose of DC feed is to supply enough power to the telephone device 220 at the customer end. The purpose of DC loop supervision is to detect changes in DC load, such as on-hook events, off-hook events and rotary dialing, or any other event that causes the DC load to change. In the interest of clarity and to avoid obscuring the invention, only that portion of the line card 205 that is helpful to the understanding of the invention is illustrated.

The voltage-feed SLIC 210 is a high voltage bipolar SLIC that drives voltages to the telephone line 225 and senses current flow in the telephone line 225. The SLIC 210 includes first and second differential line drivers 230, 235 that interface with the telephone line 225 via tip and ring terminals 237, 239. The tip terminal 237 is coupled to a first terminal of a first sensing resistor ($R_{ab}$) 240 and to an inverting terminal of the first line driver 230. A second terminal of the first sensing resistor 240 is coupled to an output terminal of the first line driver 230. The ring terminal 239 is coupled to a first terminal of a second sensing resistor ($R_{bd}$) 245 and to an inverting terminal of the second line driver 235. A second terminal of the second sensing resistor 245 is coupled to an output terminal of the second line driver 235.

The SLIC 210 includes a sum block 250 and a current-sensing circuit 260. The sum block 250 includes a first output terminal coupled to a non-inverting terminal of the first line driver 230, and a second (inverted) output terminal coupled to a non-inverting terminal of the second line driver 235. The sum block 250 is capable of receiving a DC feed signal (as well as metering and ringing signals) from a DCIN terminal 265, a voice signal, a metering signal, and a data signal and is capable of adding one or more of the received signals and providing it to the first and second line drivers 230, 235. The signals into the SUM block 250 may be subjected to different levels of gain for optimal performance. The signal from the DCIN terminal 265 is low-pass filtered.

The current-sensing circuit 260 produces a current proportional to the current through the current sensing resistors 240, 245, subtracts a current proportional to a current from a cancellation terminal (CANC) 270, and provides the resulting current to an IMT terminal 275 of the SLIC 210. Although not so limited, in the instant embodiment, the constant of proportionality for the current from the cancellation terminal (CANC) 270 is unity, and the constant of proportionality for the metallic line current is 0.001. Those skilled in the art will appreciate that only those portions of the SLIC 210 deemed relevant to the invention are disclosed herein. The SLIC 210 may employ resistors (for adjusting data input impedance) or circuitry for performing other functions that are not illustrated in FIG. 2.

Although the SLIC 210 illustrated in FIG. 2 is a voltage-feed SLIC in which a voltage is applied to the subscriber loop and a resulting current is measured, it is contemplated that a current-feed SLIC may also be utilized in the line card 205 in accordance with the instant invention. In a current-feed SLIC, a current is fed to the subscriber loop and the measured electrical parameter is the resulting voltage.

The SLIC 210 is connected to the SLAC 215 as well as to an external resistor 280, as well as a capacitor 281. A first terminal of the resistor 280 is coupled to the IMT terminal 275 of the SLIC 210, as well as to the VIN terminal 285 of the SLAC 215. A second terminal of the resistor 280 is coupled to a reference voltage node 282, as well as to a terminal of the capacitor 281. In one embodiment, the reference voltage node 282 is in the range of about 1.4 volts. The external resistor 280 and the capacitor 281 form a single-pole low pass filter that is capable of filtering at least a portion, if not all, of the signals above the voice band, such as data signals and metering signals. The combination of the external resistor 280 and the capacitor 281 contributes in converting the current flowing from the IMT terminal 275 to a proportional voltage signal for the SLAC 215. Although not necessary, the resistor 280 is external in the illustrated embodiment because in some embodiments it may be useful for the drive value of the resistor to be relatively precise and because each line card 205 may require different values.

A discrete network 288 couples the SLIC 210 to the SLAC 215 via the CANC terminals 270, 290. The discrete network 288 includes a first and second resistor 292, 294 and a capacitor 296. A first terminal of the first resistor 292 is coupled to the CANC terminal 270 of the SLIC 210 and a second terminal of the first resistor 292 is coupled to a first terminal of the second resistor 294. The second terminal of the second resistor 294 is coupled to the CANC terminal 290 of the SLAC 215. The capacitor 296 is coupled between the second terminal of the first resistor 292 and the reference voltage node 296. The discrete network 288 acts as a low pass filter and converts the voltage output signal from the SLAC 215 to a current and provides it to the SLIC 210.

The SLAC 215 interfaces with the telephonic device 220 through the SLIC 210 and over the telephone line 225. The SLAC 215 includes two feedback loops: a DC cancellation loop 298 and a DC feed loop 300. In the illustrated embodiment, the two loops 298, 300 are implemented within a digital signal processor (DSP). Only those portions of the SLAC 215 deemed relevant to the instant invention are described herein, albeit the SLAC 215 may perform a variety of other functions that are not illustrated in FIG. 2.

The DC cancellation loop 298 includes an analog-to-digital converter 305, a signal subtractor 306, delta logic 307, cancel logic 308, DC cancellation logic 315, a current limiter 317, and a digital-to-analog converter 319. In the illustrated embodiment, to reduce hardwire complexity, the voice and DC components of the input signal from the VIN terminal 285 share the same analog-to-digital converter 305. The analog-to-digital converter 305 and digital-to-analog converter 319 include a decimator and interpolator (not shown), respectively. The analog-to-digital converter 305 in the illustrated embodiment is capable of providing two output signals, the first output signal is sampled at a 4 HKz frequency and provided to the signal subtractor 306 as a digital signal. The second output signal of the analog-to-digital converter 305, comprising of voice and/or data (residual) components, is sampled at 32 HKz and provided for further voice processing. A residual data component may exist at the output of the analog-to-digital converter 305 since the single-pole low pass filter comprising the external resistor 280 and capacitor 281 may not remove all of the data signal.

The signal subtractor 306 receives the digital signal from the analog-to-digital converter 305, subtracts an input signal from the delta logic 307, and provides a difference to the DC cancellation logic 315. The combination of the signal subtractor 306, delta logic 307, cancel logic 308, and DC cancellation logic 315 forms an adaptive cancel loop 318, which is described in more detail below with respect to FIG. 7. The adaptive cancel loop 318 reduces high-frequency noise that may be introduced by the digital-to-analog converter 319.

The DC cancellation logic 315 filters high frequencies, and generates substantially a DC signal, which is then provided as an input to the DC feed logic 320, as well as to the cancel logic 308. The output of the cancel logic 308 is delivered to the current limiter 317. The output of the current limiter 317 is converted to an analog signal and then provided back to the SLIC 210 via the CANC terminal 270. The current provided to the CANC terminal 270 of the SLIC 210 cancels the DC component of the signal from the current sense circuit 260.

Without sudden or other impedance changes, the line card 205 operates in a "stable" state. During the "stable" state, the signal provided from the VIN terminal 285 of the SLAC 215 to the analog-to-digital converter 305 comprises primarily voice and data (residual) components (i.e., substantially no transient component caused by DC jumps). Thus, during the "stable" state, there is substantially no transients because the current signal provided to the CANC terminal 270 of the SLIC 210 from the SLAC 215 is substantially equal to the loop current during the "stable" state.

During the "stable" state, the output of the DC cancellation logic 315 is constant and is proportional to the DC line current. Furthermore, during the "stable" state, when substantially no transients are present, the signal level of the voice and data (residual) components does not exceed one-half of the value at the VIN terminal 285. When the signal level at the VIN terminal 285 is not saturated, the DC cancellation loop 298 behaves like a single pole high pass filter to the CODEC (not shown in FIG. 2) and a single pole low-pass filter to the output of the DC cancellation logic 315. This means, as described in more detail below, that the output of the DC cancellation logic 315 may be used to measure the DC feed current by the DC feed logic 320 for supervision purposes.

When impedance fluctuations occur on the subscriber loop, one or more components of the line card 205 may be in a "saturation" state. One instance where the subscriber loop goes into saturation mode is during a transition from off-hook to on-hook state. A transition from an off-hook to on-hook state may occur when a user terminates telephone service by engaging the switch hook, or when the telephonic device 220 employs pulse dialing, which generally comprises pulses generated by a sequence of on-hook/off-hook states. During the "saturation" state, the signal from the VIN terminal 285 of the SLAC 215 may include a voice component, data component, and transient component due to DC jumps. The signal from the VIN terminal 285 may include other components as well, such as metering signals and the like. To restore the line card 205 to a "stable" state, it is desirable to adjust the output of the DC cancellation logic 315 expeditiously to remove the line card 205 from saturation.

As described in more detail below, the DC cancellation logic 315 may include either a low-pass filter (not shown) having an adjustable bandwidth or an integrator (not shown) having an adjustable gain. The DC cancellation logic 315 includes one or more comparators (not shown) for comparing an incoming signal with preselected values, as described in more detail below. Low-pass filters, integrators, and comparators are generally known in the art; accordingly, these devices are not described in detail herein as one skilled in the art having the benefit of this disclosure is capable of employing these devices in a manner consistent with the instant invention. It should be appreciated that the DC cancellation logic 315 may be implemented either in hardware, software, or a combination thereof.

The DC feed loop 300, in addition to the analog-to-digital converter 305 and DC cancellation logic 315, includes DC feed logic 320 and a digital-to-analog converter 322. In the illustrated embodiment, the digital-to-analog converter 322 may also interpolate. The output from the digital-to-analog converter 322 is provided to a DCIN terminal 265 of the SLIC 210 via VHL terminal 323 of the SLAC 215. The DC feed logic 320 is capable of providing high DC voltage to the subscriber loop so that sufficient current (20–60 mA) can be driven through a resistance as high as 2 K ohms. When the DC conditions on the subscriber loop change suddenly, the DC feed logic 320, in accordance with the present invention, adapts, allowing normal transmission to continue. Examples of sudden changes in DC conditions include on-hook, off-hook, rotary dialing, and tone signaling. When the telephonic device 220 goes off-hook, the loop impedance drops almost instantly to a value below 2 K ohms. In short subscriber loops, the loop impedance may be less than 200 ohms. For the line card 205 to function and transmit information properly, the DC conditions on the subscriber loop should be stabilized quickly, and in some cases, within milliseconds.

Figure 3:
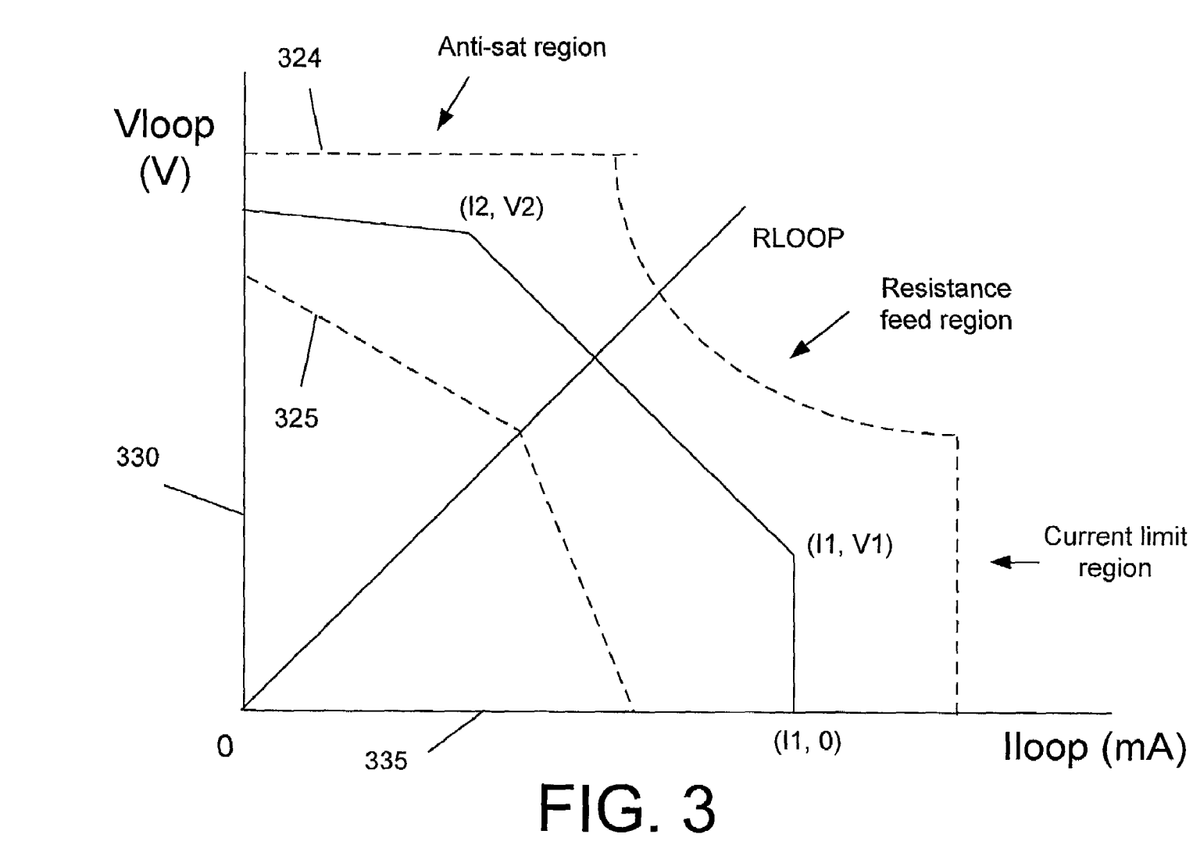
FIG. 3 depicts an exemplary DC feed curve that may be employed by the apparatus of FIG. 2.

FIG. 3 illustrates an exemplary DC feed curve that may be adapted for use by the DC feed logic 320. A dashed line 324 provides the upper limits for the electrical power, and a dashed line 325 provides the lower limits for the electrical power provided to the subscriber loop. A Y-axis 330 represents voltage, and an X-axis 335 represents current. As can be seen in FIG. 3, although not so limited, the DC feed curve includes an anti-saturation region, a resistance feed region, and a current limit region.

Figure 4:
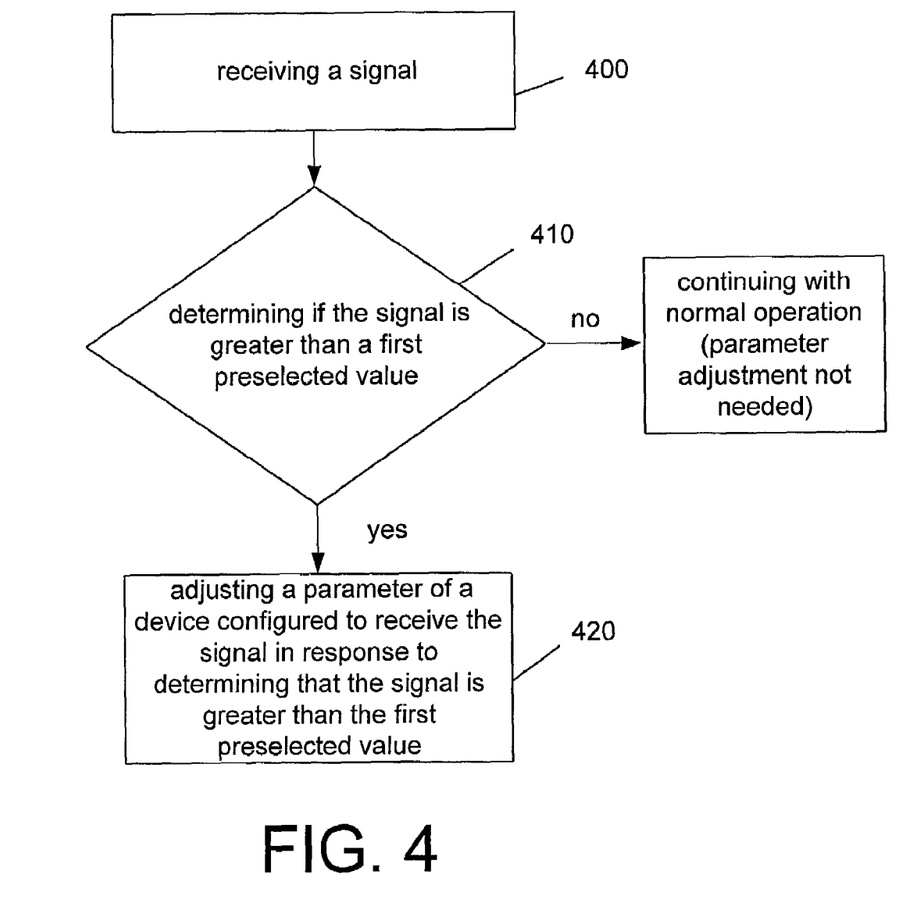
FIG. 4 illustrates a method in accordance with the present invention that may be implemented by the host transceiver of FIG. 2.

FIG. 4 illustrates a method in accordance with the present invention that may be employed by the SLAC 215 of the line card 205 of FIG. 2. The method of FIG. 4 begins at block 400, where the DC cancellation logic 315 receives a signal from the output terminal of the analog-to-digital converter 305. The signal may have an AC component (voice signal and data (residual) signal), a transient component, or both, depending on whether the line card 205 is in a "stable" or "saturation" state. At block 410, the DC cancellation logic 315 determines if the signal (absolute value) is greater than a first preselected value, wherein the preselected value is an indication that at least one of the components of the line card 205 may be in saturation. Generally, if the absolute value of the signal exceeds the first preselected value, it means that the presence of transients due to DC jumps has exceeded one-half of the value of the voltage at the VIN terminal 285. As mentioned earlier, saturation may be caused by one of several factors, including when the telephonic device 220 makes a transition from an on-hook to off-hook state, or vice-versa. For example, the first preselected value may be in the range of about 0.75 to 1 volt with respect to the reference voltage 282, which may be 1.4 volts, for example.

At block 420, the DC cancellation logic 315 adjusts a parameter of a device (not shown) configured to receive the signal in response to determining that the signal is greater than the first preselected value. The device may be a high gain, low pass filter (not shown), wherein adjusting the parameter includes increasing a filter coefficient of the low pass filter to increase the bandwidth of the DC cancellation loop 298. In an alternative embodiment, the device may be an integrator (not shown), wherein adjusting the parameter includes increasing a step size of the integrator to increase the gain of the integrator, which thereby increases the bandwidth of the DC cancellation loop 298. The integrator causes the DC cancellation loop 298 to act like a low-pass filter. For example, the corner frequency of the DC cancellation loop 298 may be increased from 9.4 Hz (during "stable" state) to 40 Hz (during the "saturation" state). The corner frequency may be determined using equation (1) below:

$$F_{corner} = \text{step size} * R_{280}/(R_{292}+R_{294}) * F_s/2\pi, \quad (1)$$

where the step size is the step size of the integrator, $R_{280}$ is the resistor 280 (see FIG. 2), $R_{292}+R_{294}$ are resistors 292 and 294 (see FIG. 2), and $F_s$ is the sampling frequency. For ease of illustration, in the illustrated embodiment the DC cancellation logic 315 includes an integrator. Increasing the bandwidth of the low pass filter or increasing the gain of the integrator increases the bandwidth of the DC cancellation loop 298, as seen from the IMT and CANC terminals 275, 270 of the SLIC 210. Increasing the step size of the integrator allows the line card 205 to recover faster from its saturation state.

Figure 5:
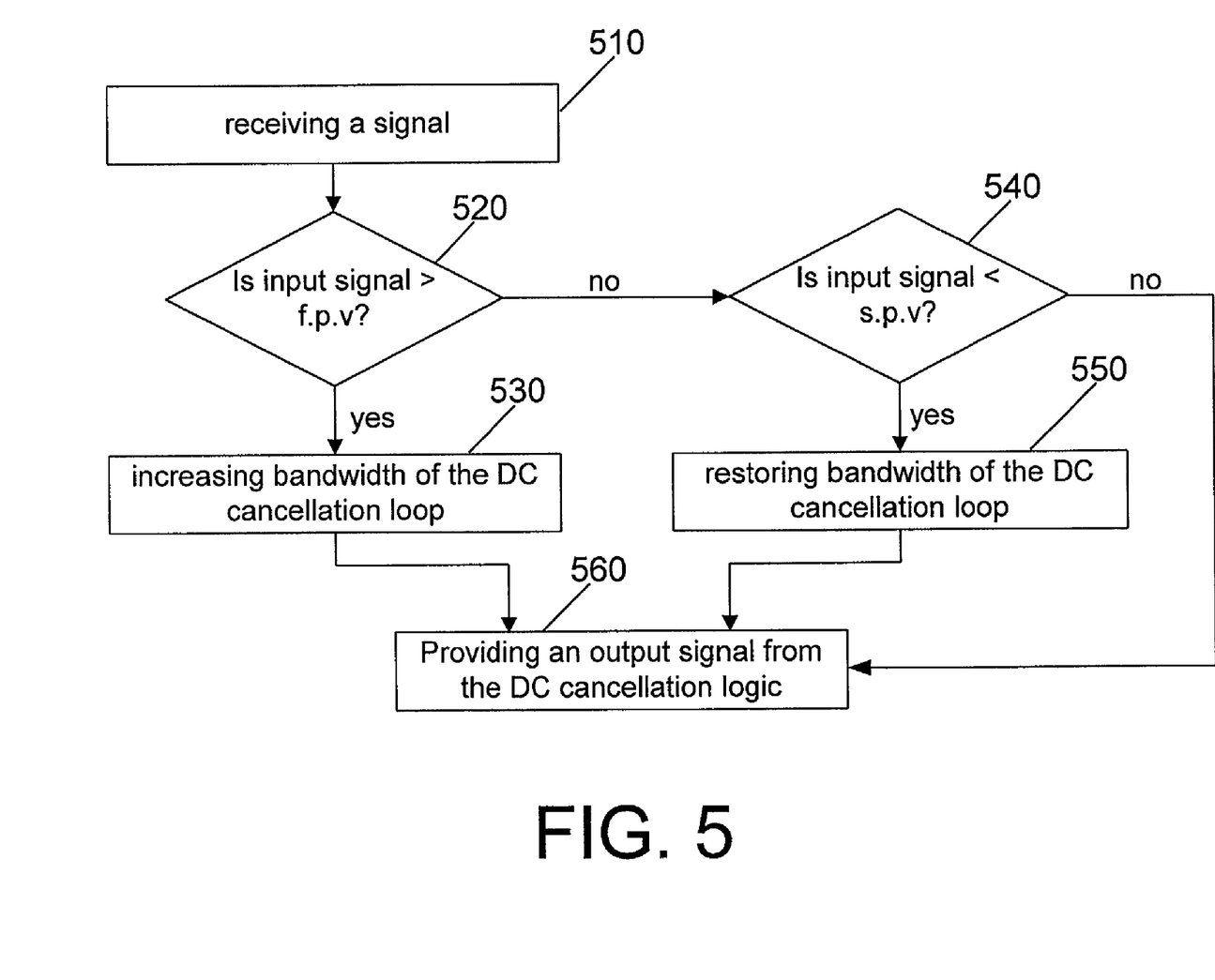
FIG. 5 illustrates an alternative embodiment of a method in accordance with the present invention that may be implemented by the host transceiver of FIG. 2.

FIG. 5 illustrates an alternative method in accordance with the present invention that may be employed by the SLAC 215 of the line card 205 of FIG. 2. The method of FIG. 5 begins at block 510, where the DC cancellation logic 315 receives a digitized signal. The signal may have an AC component (voice signal and data (residual) signal) and a transient component, depending on the "state" of the line card 205. At block 520, the DC cancellation logic 315 determines if the signal is greater than a first preselected value, wherein the first preselected value is an indication that a DC shift may be present. The DC shift may be caused by one of several factors, including when the telephonic device 220 makes a transition from an on-hook to off-hook state, or vice-versa.

At block 530, the DC cancellation logic 315 increases the bandwidth of the DC cancellation loop 298 (as seen from the SLIC 210) using a larger step size in response to determining that the signal is greater than the first preselected value. The bandwidth of the DC cancellation loop 298 may be increased by increasing the gain of an integrator (not shown). For example, during saturation, the corner frequency of the DC cancellation loop 298 may be 40 Hz. The corner frequency may be increased up to 60 Hz in some instances, after which the line cart 205 condition may become unstable.

If, however, the signal at the block 520 is not greater than the first preselected value, then, at block 540, the DC cancellation logic 298 determines if the signal is less than a second preselected value. If the signal is less than the second preselected value, then it is an indication that the line card 205 is no longer in a saturation state (i.e., substantially no DC level shift). Although not so limited, in the illustrated embodiment, the second preselected value is 0.5 volts with respect to the reference voltage 282, which may be 1.4 volts. For hysteresis control, it may be desirable to have the second preselected value less than or different from the first preselected value. The second preselected value in another embodiment may be equal to or less than the first preselected value. If the signal is less than the second preselected value, the DC cancellation logic 315, at block 550, reduces the bandwidth of the DC cancellation loop 298 since the transient state is no longer present. Since the voice component and DC component of the signal from the VIN terminal 285 of the SLAC 215 share the same analog-to-digital converter 305, reducing the bandwidth generally reduces the low frequency distortion for the voice signal that is provided to the CODEC (not shown). In one embodiment, the corner frequency of the DC cancellation loop 298 may be reduced to 9.5 Hz (from 40 Hz), since the line card 205 is out of saturation.

Assuming that in the instant embodiment the DC cancellation logic 315 employs an integrator, the output of the DC cancellation logic 315 in accordance with the present invention is governed by equation (2), shown below in time domain.

$$DCANC_n = DCANC_{n-1} + \text{step-size} \times DVIN_n, \quad (2)$$

where $DCANC_n$ is the output signal from the DC cancellation logic 315 to the current limiter 317, $DCANC_{n-1}$ is a previous sample of the output signal of the DC cancellation logic 315, step-size is the adjusted step size for the saturation state, and $DVIN_n$ is the input signal to the DC cancellation logic 315. Increasing the step size of the integrator has an overall effect of increasing the bandwidth of the DC cancellation loop 298. Conversely, decreasing the step size of the integrator reduces the bandwidth of the DC cancellation loop 298. In one embodiment, during the "stable" state, the step size may be 0.002444, and approximately 0.00888 during the "saturation" state. It will be appreciated that a variety of other step sizes may be employed, depending on the specific implementation. At block 560, the DC cancellation logic 315 provides the output signal to the cancel logic 308 and to the DC feed logic 320

Figure 6:
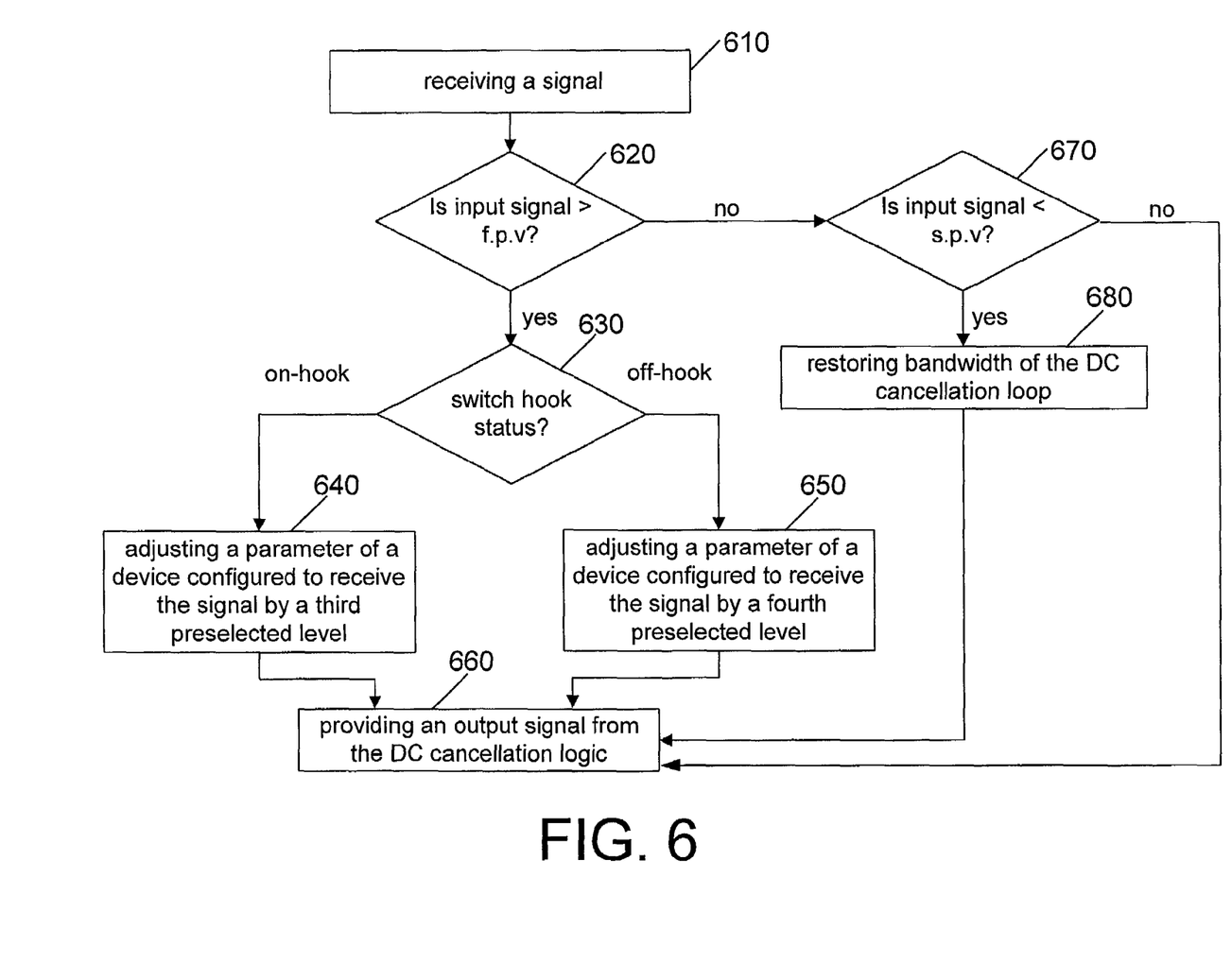
FIG. 6 depicts an alternative embodiment of a method in accordance with the present invention that may be implemented by the host transceiver of FIG. 2.

FIG. 6 illustrates an alternative method in accordance with the present invention that may be employed by the SLAC 215 of the line card 205 of FIG. 2. In this embodiment, the step size of the DC cancellation logic 315 may be changed differently depending on whether the telephonic device 220 transitions from on-hook to off-hook or from off-hook to on-hook. The method of FIG. 6 begins at block 610, where the DC cancellation logic 315 receives a digitized signal. The signal may have an AC component (voice and data (residual) signals) and a transient component. At block 620, DC cancellation logic 315 determines if the signal is greater than a first preselected value, wherein the preselected value is an indication that a DC level shift may be present.

If the input signal is greater than the first preselected value, then, at block 630, the DC cancellation logic 315 determines if the transition of the telephonic device 220 is from on-hook to off-hook, or vice versa. If the transition is from on-hook to off-hook, then, at block 640, the DC cancellation logic 315 increases a step size of a device (not shown) configured to receive the signal by a third preselected level. In contrast, if the transition is from off-hook to on-hook, then, at block 650, the DC cancellation logic 315 increases a step size of the device configured to receive the signal by a fourth preselected level. By taking into account the direction of the switch-hook transition, the DC cancellation logic 315 is able to satisfy the dial pulse distortion requirement with greater flexibility. For example, it may be possible to reduce the difference in detection time, even though the pulses may have different pulse and rise times. At block 660, the DC cancellation logic 315 provides an output current signal to the current limiter 317, to the DC feed logic 320, and to the switch-hook detection logic (not shown).

If the signal to the DC cancellation logic 315, however, is not less than the first preselected value, then at block 670, the DC cancellation logic 315 determines if the input signal is less than a second preselected value. If the input signal is less than the preselected value, then it is an indication that the line card 205 is no longer in a saturation state (i.e., no DC level shift). If the signal is less than the second preselected value, the DC cancellation logic 315, at block 680, reduces the bandwidth of the DC cancellation loop 298 since the transient state is no longer present. Since the voice component and DC component of the input signal from the VIN terminal 285 of the SLAC 215 share the same analog-to-digital converter 305, reducing the bandwidth generally reduces the low frequency distortion for the voice signal that is provided to the CODEC (not shown in FIG. 2).

The methods of FIGS. 4–6 allow the host transceiver 105 to expeditiously recover from a saturation condition (i.e., transient state) to a non-saturation condition. Recovering from a saturation condition expeditiously is desirable during switch-hook detection since many line cards 205 determine the on-hook or off-hook state of the telephonic device 220 based on the measured loop voltage and current.

Figure 7:
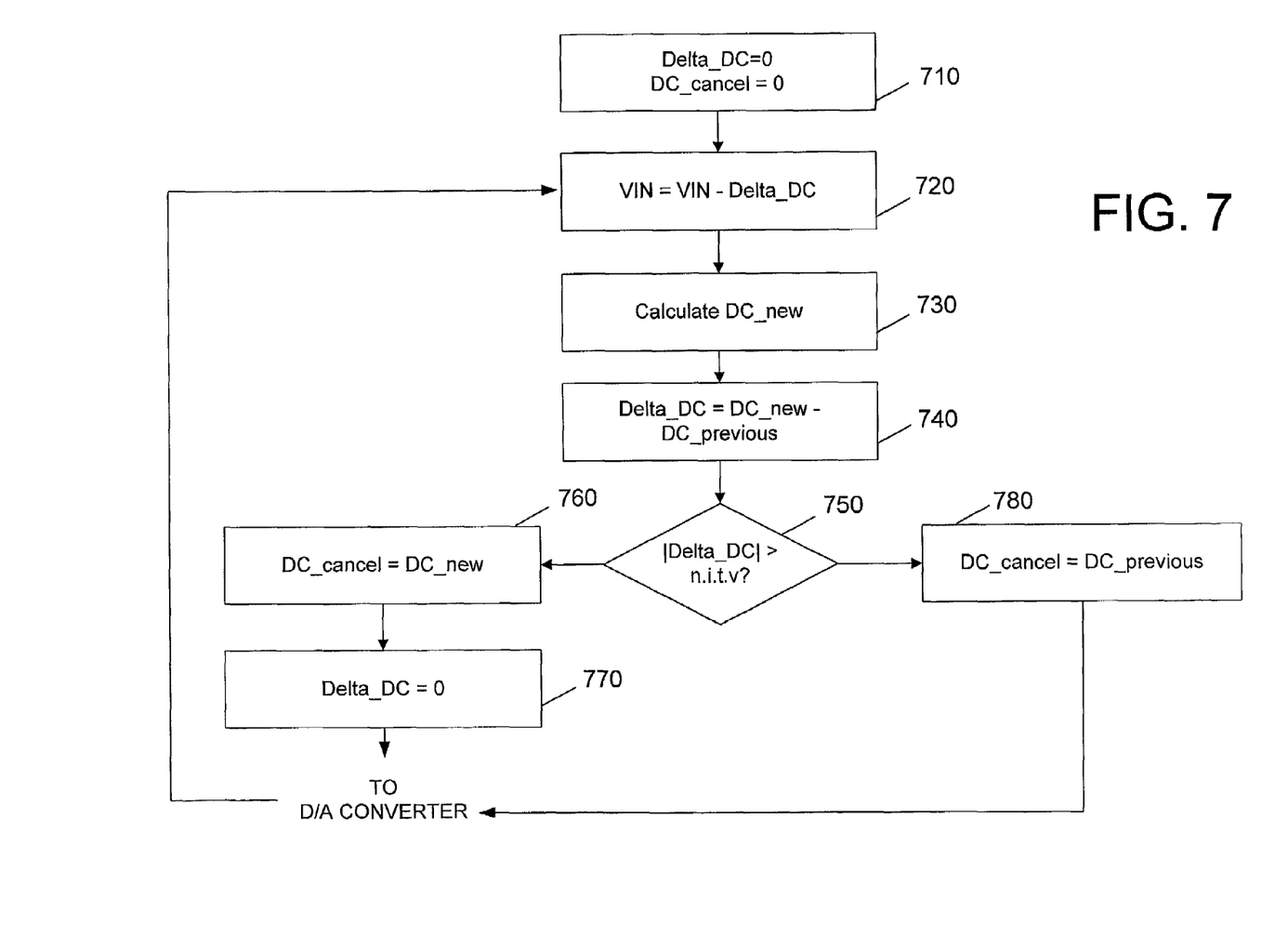
FIG. 7 illustrates a method in accordance with the present invention that may be implemented by the host transceiver of FIG. 2 to reduce noise introduced by a digital-to-analog converter of the host transceiver of FIG. 2.

FIG. 7 illustrates a method in accordance with the present invention that may be employed by the line card 205 of FIG. 2. Specifically, the method of FIG. 7 can be employed by the line card 205 to reduce the quantization noise introduced by the digital-to-analog converter 319, particularly when the digitized input to the converter 319 comprises samples that vary only slightly in value. The samples may, for example, vary "slightly in value" if the only difference between the samples is in the last significant bit.

The method of FIG. 7 begins at block 710, where variables delta_DC and DC_cancel are initialized to zero. The variable Delta_DC represents the difference between the current output of the DC cancellation logic 315 and the previous output of the DC cancellation logic 315. The variable DC_cancel represents the value that is ultimately provided to the current limiter 317, and eventually to the digital-to-analog converter 319, by the cancel logic 308 (see FIG. 2).

At block 720, the signal subtractor 306 provides a difference between the output signal (VIN) from the analog-to-digital converter 305 and the output signal (Delta_DC) from the delta logic 307. The signal subtractor 306 may be any type of logic, software or hardware, capable of taking two input signals and providing a difference between the two input signals. At block 730, the DC cancellation logic 315, based on the output signal of the signal subtractor 306, generates a DC signal (DC_new) for canceling the loop current from the subscriber line 225. At block 740, the delta logic 307 calculates the value of Delta_DC, which is the difference between the current output (DC_new) of the DC cancellation logic 315 and the previous output (DC_previous) of the DC cancellation logic 315. The value of Delta_DC is fed back to the signal subtractor 306, which subtracts the Delta_DC from the VIN value and provides a difference to the DC cancellation logic 315.

At block 750, the cancel logic 308 determines if the value of the Delta_DC is greater than a noise-immunity-threshold value (NITV). Although not so limited, in the illustrated embodiment, it is the absolute value of the Delta_DC that is compared to the NITV. Generally, the value of NITV will be implementation specific, although in the illustrated embodiment the NITV is from 1/100th to 1/10th of the maximum full scale value of VIN, which is 1.02 volts (corresponding current value is substantially 68 mA). The NITV may be 1/100th to 1/10th of the input voltage of the analog-to-digital converter 305. The value of NITV may be programmed by the user. If Delta_DC is greater than the NITV, then, at block 760, the cancel logic 308 sets DC_cancel to DC_new, the output value of the DC cancellation logic 315. If the Delta_DC is greater than the NITV, it is an indication that output (i.e., the DC_new value) of the DC cancellation logic 315 is adequately different from the previous value (DC_previous) that the new output of the DC cancellation logic 315 is ultimately provided to the digital-to-analog converter 319. Accordingly, the cancel logic 308 provides the DC_cancel value to the digital-to-analog converter 319 via the current limiter 317. At block 770, the cancel logic 308 requests the delta logic 307 to set the Delta_DC to zero.

If the Delta_DC value is not greater than the NITV, then, at block 780, the cancel logic 308 provides the previous output (DC_previous) of the DC cancellation logic 315 to the digital-to-analog converter 319 via the current limiter 317. If the Delta_DC value is not greater than the NITV, then it is an indication that the difference between the new output and the previous output of the DC cancellation logic 315 is relatively small, and that it is not necessary to update the digital-to-analog converter 319 since it may introduce flat or high-frequency quantization noise. Thus, when the Delta_DC value is not greater than the NITV, the cancel logic 308 provides to the digital-to-analog converter 319 the previous output value (DC_previous) of the DC cancellation logic 315.

With the adaptive cancel loop 318, the line card 205 is able to reduce the high-frequency noise introduced by the analog-to-digital converter 319. It does so by providing an input signal to the digital-to-analog converter 319 in a quantized manner. The residue DC value (i.e., Delta_DC) between the two quantized signals (i.e., DC_new and DC_previous) is fed back negatively internally through the adaptive cancel loop 318 without going through the cancellation feed back loop 298. The DC value ultimately provided to the digital-to-analog converter 319 and the residue value fed back internally are updated adaptively based on the NITV.

To remove the quantization noise induced by the digital-to-analog converter 319, it is possible to use a more expensive digital-to-analog converter that has a higher sampling rate. For example, without the instant invention, the digital-to-analog converter 319 might have to operate at 2 MHz. The noise using a 2 MHz converter will peak at approximately 1 MHz, which is substantially at the end of the ADSL data transfer band. Each doubling of the over-sampling ratio also reduces the noise in the signal band by 9 dB and provides 1.5 bits of extra resolution. This can avoid injecting high-frequency noise when the variation in the input signal is relatively small. However, as described above, the instant invention allows for a more cost-effective solution to reduce the undesirable, high-frequency noise that may interfere with data transfer in the line card 205.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for DC level control for a line card, comprising:
   receiving a digital input signal;
   determining a first DC component value of the digital input signal at a first selected time;
   determining a second DC component value of the digital input signal at a second selected time;
   determining a difference between the first DC component value and the second DC component value; and
   providing the first DC component value to a digital-to-analog converter in response to determining that the difference is less than a first selected value.

2. The method of claim 1, further comprising subtracting the difference between the first DC component value and the second DC component value from the digital input signal.

3. The method of claim 1, further comprising providing the second DC component value to a digital-to-analog converter in response to determining that the difference is greater than the first selected value.

4. The method of claim 1, the line card being linked to a customer premises by a subscriber line, wherein determining the second DC component value of the digital input signal at the second selected time includes determining a value proportional to the DC component of a signal on the subscriber line.

5. The method of claim 1, wherein the digital input signal includes voice and data components.

6. The method of claim 1, the line card including an analog-to-digital converter, wherein the first selected value is in a range of $1/100^{th}$ to $1/10^{th}$ of full scale voltage of the analog-to-digital converter.

7. An apparatus, comprising:
   a digital-to-analog converter; and
   logic coupled to the digital-to-analog converter, the logic capable of:
      receiving a digital input signal;
      determining a first DC component value of the digital input signal at a first selected time;
      determining a second DC component value of the digital input signal at a second selected time;
      determining a difference between the first DC component value and the second DC component value; and
      providing the first DC component value to the digital-to-analog converter in response to determining that the difference is less than a first selected value.

8. The apparatus of claim 7, wherein the logic is further capable of subtracting the difference between the first DC component value and the second DC component value from the digital input signal.

9. The apparatus of claim 7, wherein the logic is further capable of providing the second DC component value to a digital-to-analog converter in response to determining that the difference is greater than the first selected value.

10. The apparatus of claim 7, wherein the digital input signal includes voice and data components.

11. The apparatus of claim 7, the apparatus including an analog-to-digital converter, wherein the first selected value is in a range of $1/100^{th}$ to $1/10^{th}$ of full scale voltage of the analog-to-digital converter.

12. An apparatus, comprising:
   a digital-to-analog converter; and
   a DC cancellation feedback loop comprising:
      an analog-to-digital converter capable of receiving a signal having a DC component from a subscriber line, the analog-to-digital converter capable of converting the signal to a digital signal;
      DC cancellation logic capable of approximating a first DC value proportional to the DC component of the digital signal at a first selected time and a second DC value proportional to the DC component of the digital signal at a second selected time;
      first logic capable of determining a difference between the first DC value and the second DC value and providing the difference to the DC cancellation logic; and
      second logic capable of providing the first DC value to the digital-to-analog converter in response to determining that the difference is less than a first selected value.

13. The apparatus of claim 12, wherein the second logic is further capable of providing the second DC component value to a digital-to-analog converter in response to determining that the difference is greater than the first selected value.

14. The apparatus of claim 12, wherein the digital signal includes voice and data components.

15. The apparatus of claim 12, the apparatus including an analog-to-digital converter, wherein the first selected value is in a range of $1/100^{th}$ to $1/10^{th}$ of full scale voltage of the analog-to-digital converter.

16. A line card, comprising:
   a subscriber line interface circuit capable of interfacing with a telephonic device and providing a signal;
   a digital-to-analog converter; and
   a digital signal processor configured to receive the signal from the subscriber line interface circuit, the digital signal processor capable of:
      determining a first DC component value of a received digital input signal at a first selected time;
      determining a second DC component value of the digital input signal at a second selected time;
      determining a difference between the first DC component value and the second DC component value; and
      providing the first DC component value to the digital-to-analog converter in response to determining that the difference is less than a first selected value.

17. The line card of claim 16, wherein the digital signal processor is further capable of subtracting the difference between the first DC component value and the second DC component value from the digital input signal.

18. The line card of claim 16, wherein the digital signal processor is further capable of providing the second DC component value to a digital-to-analog converter in response to determining that the difference is greater than the first selected value.

19. The line card of claim 16, wherein the digital input signal includes voice and data components.

20. An apparatus, comprising:
   means for receiving a digital input signal;
   means for determining a first DC component value of the digital input signal at a first selected time;
   means for determining a second DC component value of the digital input signal at a second selected time;
   means for determining a difference between the first DC component value and the second DC component value; and
   means for providing the first DC component value to a digital-to-analog converter in response to determining that the difference is less than a first selected value.

* * * * *